United States Patent
Putzeys

(10) Patent No.: US 6,473,475 B1
(45) Date of Patent: Oct. 29, 2002

(54) SAMPLE RATE CONVERTER USING POLYNOMIAL INTERPOLATION

(75) Inventor: Bruno J. G. Putzeys, Leuven (BE)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/298,231

(22) Filed: Apr. 23, 1999

(30) Foreign Application Priority Data

Apr. 27, 1998 (EP) .............................................. 98201334

(51) Int. Cl.[7] ............................ H03M 7/00; G06F 17/17
(52) U.S. Cl. ............................ 375/350; 341/61; 708/313
(58) Field of Search .................................. 375/241, 242, 375/247, 316, 346, 350, 355; 341/61, 143; 708/313

(56) References Cited

U.S. PATENT DOCUMENTS

| 4,797,845 A | 1/1989 | Stikvoort | 364/724.1 |
| 5,335,074 A * | 8/1994 | Stec | 348/537 |
| 5,365,468 A | 11/1994 | Kakubo et al. | |
| 5,513,209 A * | 4/1996 | Holm | 375/354 |
| 5,559,513 A * | 9/1996 | Rothermel et al. | 341/61 |
| 5,892,468 A * | 4/1999 | Wilson et al. | 341/61 |
| 5,907,295 A * | 5/1999 | Lin | 341/61 |
| 5,921,932 A * | 7/1999 | Wright et al. | 600/447 |
| 6,041,339 A * | 3/2000 | Yu et al. | 708/313 |
| 6,101,864 A * | 8/2000 | Abrams et al. | 73/1.01 |
| 6,226,661 B1 * | 5/2001 | Savell | 708/313 |

FOREIGN PATENT DOCUMENTS

| EP | 0512619 A1 | 11/1992 | .......... H03H/17/06 |
| EP | 0658979 A2 | 6/1995 | |

* cited by examiner

Primary Examiner—Young T. Tse
(74) Attorney, Agent, or Firm—Edward W. Goodman

(57) ABSTRACT

A sample rate converter for converting the sampling frequency of an input signal from a first frequency to a second frequency. Such a sample rate converter uses interpolator and a phase-locked loop receiving the first and the second sampling frequency. The interpolator is implemented as a polynomial interpolator.

6 Claims, 2 Drawing Sheets

SAMPLE RATE CONVERTER USING POLYNOMIAL INTERPOLATION

BACKGROUND OF THE INVENTION

1. Field of the Invention

The invention relates to a sample rate converter for converting the sampling frequency of an input signal from a first frequency to a second frequency, said sample rate converter comprising input means for receiving the input signal with the first sampling frequency, output means for supplying an output signal with the second sampling frequency, converting means for converting the input signal into the output signal, said converting means comprising interpolation means, and a phase-locked loop for receiving the first and second frequency, and for controlling the converting means. The invention further relates to converting means for use in a sample rate converter.

The invention further relates to a method for converting the sampling frequency of an input signal from a first frequency to a second frequency, said method comprising the steps of receiving the input signal with the first sampling frequency, and converting the input signal into an output signal with the second sampling frequency using interpolation, wherein the converting step is controlled by a signal depending on the difference between the first and second sampling frequencies.

2. Description of the Related Art

In the U.S. Pat. No. 4,797,845, a sample rate converter, using a high over-sampling and hold, or linear interpolation at high frequencies, is described.

In European Patent Application EP-A-0695032 a sample rate converter has been described, having a digital low-pass filter with a so-called piece-wise continuous linear hull curve. Further, European Patent Application EP-A-0512619, corresponding to U.S. Pat. No. 5,225,787, discloses a sample rate converter using a sigma delta modulator as a noise shaper.

A disadvantage of the prior art sample rate converters is that most of the prior art sample rate converters can not be implemented in software. A further disadvantage of the prior art sample rate converters is that the complexity of the converter increases exponentially with a required improved performance.

SUMMARY OF THE INVENTION

An object of the invention is to provide a sample rate converter, converting means and a method that do not have the disadvantages of the prior art. To this end, a first aspect of the invention provides a sample rate converter above, in which the interpolation means are polynomial interpolation means. A second aspect of the invention provides converting means for use in such a sample rate converter. A third aspect of the invention provides a method described above, in which the converting of the input signal into the output signal is obtained by polynomial interpolation.

The invention can be used for asynchronous (that is input and output clock of the system are not related) as well as synchronous (fractional) sample rate conversion.

Further the invention can be efficiently used in a so-called embedded solution (software). No look-up tables and/or hardware accelerators are necessary.

The basic idea of the invention is to make use of a high-order polynomial in order to calculate an approximation of the signal value at a certain time. In digital signal processing, until now high-order polynomials or non-linear functions of time were not used as being far too complex.

The time at which the value is required can be determined by means that compares the incoming clock with the outgoing clock, for example a phase-locked loop (PLL). The order of the polynomial depends on the number of available samples chosen to determine the actual value of the signal at the new time instant. In essence, the only correct value without approximating at the new time instant is determined by a summation of an infinite number of sin(x)/x functions, with the relevant sample present in the input signal as a center value. The polynomial is used to calculate an approximation of the signal value at a certain time.

The precision of the approximation required will increase the order of the polynomial interpolation.

It is to be noted that "New High Accuracy Pulse Width Modulator Based on Digital-To-Analogue Convertor/Power Amplifier", J. M. Goldberg, M. B. Sandier, IEE Proc.-Circuits Devices Syst., Vol 141, No.4, August 1994, pp 315–324 describes polynomial interpolation to improve linearity, not for a sample rate converter.

An embodiment of a sample rate converter according to the invention is characterized is that the input means comprises an up-sampler.

By using an up-sampler before the polynomial interpolation means, with a lower-order polynomial function, the same degree of resolution can be achieved. If necessary a down-sampler can be used.

Performance may be further improved by using the converting means to convert the signal to a sample rate which is multiple of the desired sample rate, and by then converting that signal to the desired sample rate using a decimation filter.

An embodiment of a sample rate converter according to the invention is characterized in that the converting means comprises a look-up table with pre-calculated FIR coefficients.

By combining the polynomial interpolation with the look-up table for higher order FIR filters, the advantages of both means can be combined, whereby the look-up table comprises one or more sets of coefficients, and can be used for certain difference values between the input and output clocks and the polynomial interpolation between the sets.

An embodiment of a sample rate converter according to the invention is characterized in that the polynomial interpolation means use $$Y(x) = \sum_{i=0}^{m+n} x^i \sum_{j=0}^{m+n} a_{i,j} y(j-m)$$

wherein Y(x)=the interpolated signal, and y(j−m)=the input sample.

Using these formulas, the polynomial interpolation can be easily implemented in a digital signal processor.

An embodiment of a method according to the invention is characterized in that the method uses a combination of a look-up table and the polynomial interpolation for converting the input signal.

By combining the polynomial interpolation with a look-up table, the efficiency of the method is further improved.

BRIEF DESCRIPTION OF THE DRAWINGS

The invention and additional features which may optionally be used to implement to advantage will be apparent from and elucidated with reference to the examples described hereinafter and shown in the drawings, in which.

DESCRIPTION OF THE PREFERRED EMBODIMENTS

Figure 1:
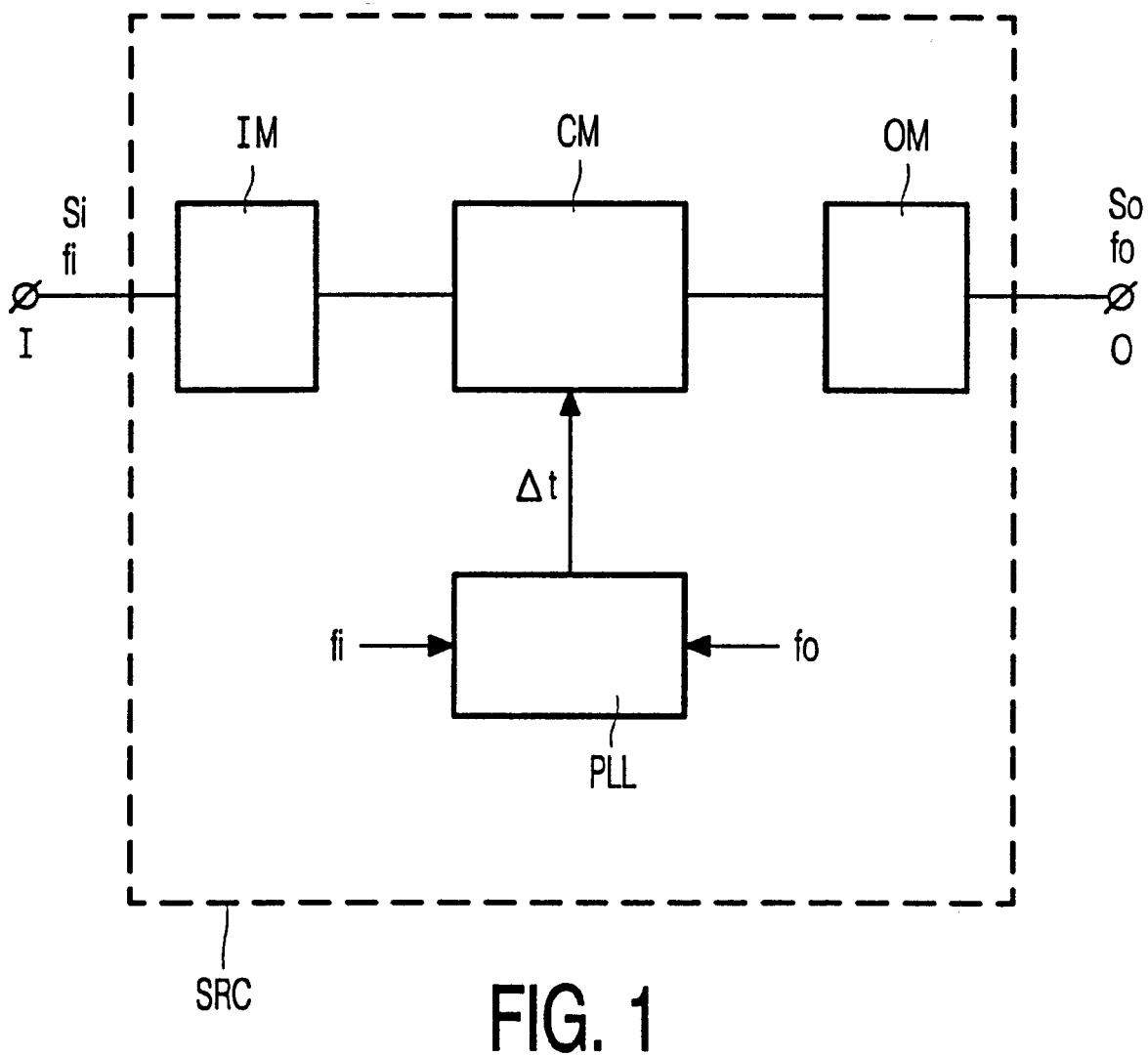
FIG. 1 shows a block schematic diagram of a sample rate converter according to the invention.

FIG. 1 shows a block schematic diagram of a sample rate converter SRC according to the invention having, an input I, receiving an input signal Si with a sampling frequency fi and an output o for supplying an output signal So with a sampling frequency fo. The sample rate converter further comprises input means IM for handling the input signal, and output means OM for handling and supplying the output signal. The input means is coupled to converting means CM for converting the input signal with the input sampling frequency to the output signal with the output sampling frequency. The converting means are controlled by a difference signal Δt depending on the difference between the input and output sampling frequencies, whereby in this example, the input and output sampling frequencies are supplied to a phase-locked loop PLL, this phase-locked loop supplying the difference signal Δt as a control signal to the converting means.

The input means and output means can both comprise a so-called FIFO (first in first out) for buffering the input and output signals, respectively.

Further an up-sampler for example, in the input means can be used to improve the degree of resolution by using the same polynomial. Instead, it is also possible to lower the degree of the polynomial and obtain the same degree of resolution. By using an up-sampler the path of the signal between the neighboring signal values can be used to approximate the new value.

Down-sampling will not be necessary in most cases because it is not necessary to calculate the interpolated samples with a frequency which is (for example) four times the required frequency. Nevertheless down-sampling will further improve the performance.

Figure 2:
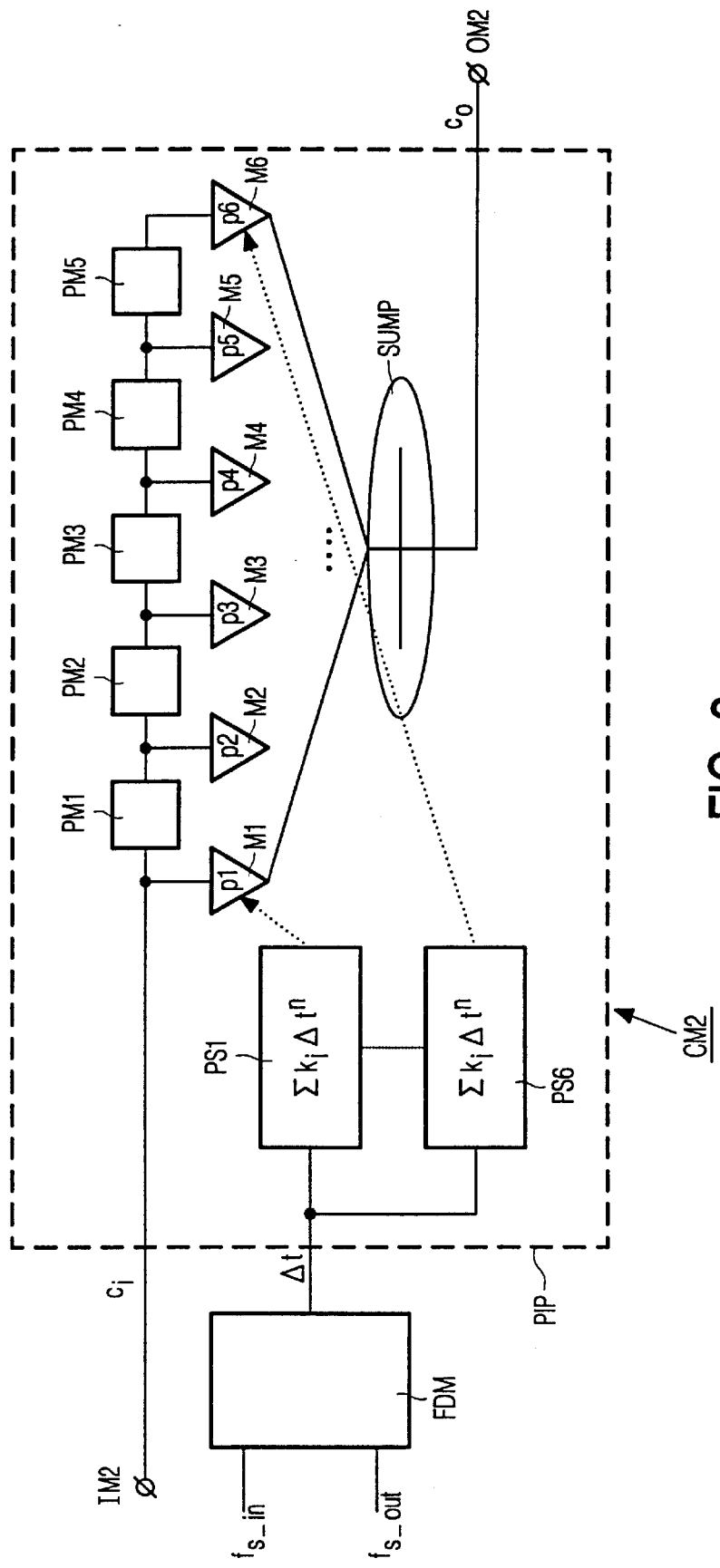
FIG. 2 shows a more detailed block schematic diagram of converting means of a sample rate converter according to the invention.

FIG. 2 shows an example of converting means CM2 for use in a sample rate converter according to the invention. The converting means comprises a polynomial interpolation part PIP. Further, in this example, the converting means CM2 comprises a frequency difference measurement device FDM for supplying a difference value Δt.

The polynomial interpolation part PIP comprises polynomial constants summing means PS1–PS6 for obtaining polynomial constants p1–p6 depending on the difference signal Δt. These polynomial constants are supplied to constant multipliers M1–M6.

In this example the interpolation polynomial is $$Y(x) = \sum_{i=0}^{6} k_i x^i,$$

using the input samples y(−m) . . . , y(−1), y(0),y(1), . . . y(n)
m=n, or m=n−1
with
Y(−m)=y(−m)
.
.
.
Y(0)=y(0)
.
.
Y(n)=y(n)

$$k_i = \sum_{j=0}^{m+n} a_{i,j} y(j-m)$$

$$Y(x) = \sum_{i=0}^{6} x^i \sum_{j=0}^{m+n} a_{i,j} y(j-m);$$

The coefficients $a_{i,j}$ are obtained by solving the set of equations Y(−m)=y(−m) . . . Y(0)=y(0) . . . Y(n)=y(n).

The input signal Ci of the converting means CM2 is supplied to the polynomial interpolation part, PIP. This input signal is multiplied in multipliers PM1–PM5. The inputs of the multipliers PM1–PM5 are respectively supplied to the constant multipliers M1–M6. The multiplication factors p1–p6 are obtained by the polynomial constants summing means PS1–PS6 using the above formulas. The output of the multiplier PM5 is coupled to the constant multiplier M6.

The outputs of the constant multipliers M1–M6 are coupled to summing means SUMP for adding all components of the polynomial to form the interpolation signal Co.

It is possible to combine the polynomial converting means with a look-up table for higher-order FIR filters. The advantages of both means can be combined in this way, whereby the look-up table is used for samples nearby the incoming samples and the polynomial interpolation is used for the other (further away) samples.

In the above description, the idea of the invention has been described on the basis of a detail example. The person skilled in the art will be well aware of a lot of different solutions that fall within the scope of the invention concerned.

As described above, a combination of polynomial interpolation and a look-up table can further improve the sample rate converter.

Further, the degree of polynomial interpolation can be amended as required.

The core of the invention is to make use of a polynomial in order to calculate an approximation of the signal value at a certain time. This can be implemented in a digital signal processor or in software. Further, the invention can be used by both asynchronous and synchronous sample rate converters.

What is claimed is:

1. A sample rate converter for converting the sampling frequency of an input signal from a first sampling frequency to a second sampling frequency, said sample rate converter comprising:

input means for receiving the input signal with the first sampling frequency;

output means for supplying an output signal with the second sampling frequency;

converting means for converting the input signal into the output signal, said converting means comprising interpolation means; and a phase-locked loop for receiving the first and second sampling frequencies, and for controlling the converting means, characterized in that the interpolation means comprises polynomial interpolation means using the formula:

$$Y(x) = \sum_{i=0}^{6} x^i \sum_{j=0}^{m+n} a_{i,j} y(j-m);$$

wherein Y(x)=the output signal, and y(j−m)=an input signal sample.

2. The sample rate converter as claimed in claim 1, characterized in that the input means comprises an up-sampler.

3. The sample rate converter as claimed in claim 2, characterized in that the output means comprises a down-sampler.

4. The sample rate converter as claimed in claim 1, characterized in that the converting means further comprises a look-up table with pre-calculated FIR coefficients.

5. A method for converting the sampling frequency of an input signal from a first sampling frequency to a second sampling frequency, said method comprising the steps of:

receiving the input signal with the first sampling frequency; and converting the input signal into an output signal with the second sampling frequency using interpolation, wherein the converting step is controlled by a signal depending on the difference between the first and second sampling frequencies, characterized in that the interpolation used in the converting step is polynomial interpolation using the formula:

$$Y(x) = \sum_{i=0}^{6} x^i \sum_{j=0}^{m+n} a_{i,j} y(j-m);$$

wherein Y(x)=the output signal, and y(j−m)=an input signal sample.

6. The method as claimed in claim 5, characterized in that the method uses a combination of a look-up table and the polynomial interpolation for converting the input signal.

* * * * *